(12) United States Patent
Hong et al.

(10) Patent No.: US 11,501,806 B2
(45) Date of Patent: Nov. 15, 2022

(54) MEMORY DEVICE WITH TEMPERATURE INFORMATION CONTROLLER AND OPERATING METHOD OF THE MEMORY DEVICE

(71) Applicant: SK hynix Inc., Icheon-si (KR)

(72) Inventors: Yong Hwan Hong, Icheon-si (KR); Byung Ryul Kim, Icheon (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/184,351

(22) Filed: Feb. 24, 2021

(65) Prior Publication Data
US 2022/0059141 A1  Feb. 24, 2022

(30) Foreign Application Priority Data
Aug. 21, 2020 (KR) .......................... 10-2020-0105550

(51) Int. Cl.
*G11C 7/04* (2006.01)
*G11C 7/22* (2006.01)
*G11C 7/10* (2006.01)

(52) U.S. Cl.
CPC .............. *G11C 7/04* (2013.01); *G11C 7/1051* (2013.01); *G11C 7/1078* (2013.01); *G11C 7/22* (2013.01)

(58) Field of Classification Search
CPC ....... G11C 7/04; G11C 7/1051; G11C 7/1078; G11C 7/22
See application file for complete search history.

(56) References Cited

U.S. PATENT DOCUMENTS

| 8,238,185 B2 * | 8/2012 | Lee | G11C 7/04 |
| | | | 365/211 |
| 9,064,545 B2 * | 6/2015 | Cho | G11C 16/10 |
| 9,105,357 B2 * | 8/2015 | Namai | G11C 7/04 |
| 9,343,121 B2 * | 5/2016 | Jang | G11C 11/40626 |
| 9,465,757 B2 * | 10/2016 | Son | G11C 7/04 |

(Continued)

FOREIGN PATENT DOCUMENTS

| KR | 100719181 B1 | 5/2007 |
| KR | 1020130042373 A | 4/2013 |

*Primary Examiner* — Vanthu T Nguyen
(74) *Attorney, Agent, or Firm* — William Park & Associates Ltd.

(57) ABSTRACT

A storage device including: a peripheral circuit configured to perform a plurality of internal operations corresponding to a plurality of internal operation commands input from the memory controller, a temperature information controller configured to generate a first temperature code corresponding to an internal temperature at a time at which an internal operation corresponding to a first internal operation command among the plurality of internal operation commands is performed and temperature code generation information representing information that the first temperature code has been generated during a set period and a operation controller configured to control the peripheral circuit to perform an internal operation corresponding to a second internal operation command input after the first internal operation command among the plurality of internal operation commands is input, based on the first temperature code and the temperature code generation information, in response to the second internal operation command.

14 Claims, 15 Drawing Sheets

(56) References Cited

U.S. PATENT DOCUMENTS

| | | | |
|---|---|---|---|
| 9,958,845 B2* | 5/2018 | Jung | G05B 15/02 |
| 2012/0134213 A1* | 5/2012 | Choi | G11C 7/04 |
| | | | 365/185.18 |

* cited by examiner

MEMORY DEVICE WITH TEMPERATURE INFORMATION CONTROLLER AND OPERATING METHOD OF THE MEMORY DEVICE

CROSS-REFERENCE TO RELATED APPLICATION

The present application claims priority under 35 U.S.C. § 119(a) to Korean patent application number 10-2020-0105550 filed on Aug. 21, 2020, in the Korean Intellectual Property Office, the entire disclosure of which is incorporated by reference herein.

BACKGROUND

1. Technical Field

The present disclosure generally relates to an electronic device, and more particularly, to a memory device and an operating method of the memory device.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there may be provided a memory device including: a peripheral circuit configured to perform a plurality of internal operations corresponding to a plurality of internal operation commands input from the memory controller; a temperature information controller configured to generate a first temperature code corresponding to an internal temperature at a time at which an internal operation corresponding to a first internal operation command among the plurality of internal operation commands is performed and temperature code generation information representing information that the first temperature code has been generated during a set period; and an operation controller configured to control the peripheral circuit to perform an internal operation corresponding to a second internal operation command input after the first internal operation command among the plurality of internal operation commands is input, based on the first temperature code and the temperature code generation information, in response to the second internal operation command.

In accordance with another aspect of the present disclosure, there may be provided a method for operating a memory device, the method including: receiving a first internal operation command input from a memory controller; generating a first temperature code corresponding to an internal temperature at a time at which an internal operation corresponding to the first internal operation command is performed, in response to the first internal operation command; generating temperature code generation information representing information that the first temperature code has been generated during a set period; receiving a second internal operation command input from the memory controller; and performing an internal operation corresponding to the second internal operation command, based on the first temperature code and the temperature code generation information, in response to the second internal operation command.

In accordance with still another aspect of the present disclosure, there may be provided a memory device including: a first memory chip configured to receive a first internal operation command input from a memory controller, and store a temperature code generated according to the first internal operation command and temperature code generation information representing information that the temperature code has been generated during a set period; and a second memory chip configured to receive a second internal operation command input from the memory controller after the first internal operation command is input to the first memory chip, and perform an internal operation corresponding to the second internal operation command, based on the temperature code and the temperature code generation information, which are stored on the first memory chip, in response to the second internal operation command.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments may provide a memory device having an improved operation speed and an operating method of the memory device.

Figure 1:
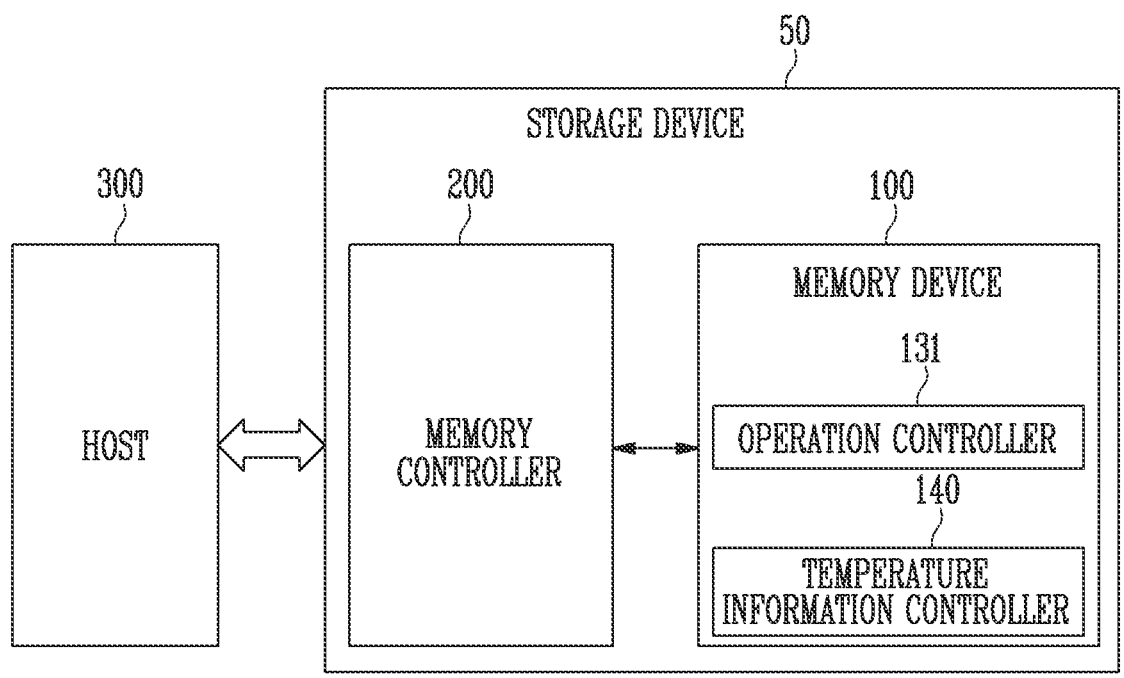
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may operate as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 may receive a command CMD and an address ADDR from the memory controller 200, and access a zone selected by the address ADDR in the memory cell array. The memory device 100 may perform an operation indicated by the command CMD on the zone selected by the address ADDR. For example, the memory device 100 may perform a write operation (program operation), a read operation, and an erase operation. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

In an embodiment, the memory device 100 may include an operation controller 131 and a temperature information controller 140.

The operation controller 131 may control the memory device 100 to perform an internal operation according to an internal operation command input from the memory controller 200. The internal operation may include a read operation, a program operation, and an erase operation.

In an embodiment, the operation controller 131 may control the memory device 100 to perform the internal operation, based on a temperature code generated by the temperature information controller 140. For example, the operation controller 131 may control the memory device 100 to generate an internal voltage for performing the internal operation, based on the temperature code generated by the temperature information controller 140. Also, the operation controller 131 may control the memory device 100 to perform the internal operation by using the internal voltage compensated according to the temperature code.

The temperature information controller 140 may measure an internal temperature of the memory device 100.

The temperature information controller 140 may generate a temperature code corresponding to the measured internal temperature. In an embodiment, the temperature information controller 140 may include a digital temperature sensing circuit. For example, the temperature information controller 140 may convert the measured internal temperature into a temperature code as a digital signal and output the temperature code.

For example, the temperature information controller 140 may sense a temperature of the memory device 100 in response to a command (e.g., a temperature measurement command) transmitted from the memory device 100 or the memory controller 200, and output a code corresponding to the sensed temperature. Also, the temperature information controller 140 may perform an operation of sensing a temperature of the memory device 100 and outputting a code whenever an internal operation is performed, regardless of the command transmitted from the memory device 100 or the memory controller 200.

When the memory device 100 performs a program operation, a read operation, or an erase operation, an internal temperature of the memory device 100 may change. The internal temperature may correspond to a temperature of the memory device 100. Alternatively, the internal temperature may correspond to a temperature of the memory cell array. The internal temperature of the memory device 100 may increase as the memory device 100 frequently performs the program operation, the read operation, or the erase operation. When the internal temperature of the memory device 100 becomes excessively high, the probability that the program operation, the read operation, or the erase operation will fail may increase. That is, when the internal temperature of the memory device 100 becomes excessively high, the performance of the memory device 100 may be degraded. Therefore, the memory controller 200 may control the temperature information controller 140 to measure a temperature whenever an internal operation of the memory device 100 is performed.

However, when an interval between a plurality of internal operations is short, the time required to perform the plurality of internal operations is lengthened since a temperature is measured whenever each internal operation is performed. Thus, in accordance with the embodiment of the present disclosure, the memory device 100 omits an operation of measuring an internal temperature with respect to internal operation commands input during a set period, and performs internal operations corresponding to the internal operation commands, based on a pre-generated temperature code, so that the operation speed of the memory device 100 can be improved.

In an embodiment, the memory device may generate temperature code generation information representing that a temperature code has been generated during the set period.

Also, the memory device 100 may determine whether an internal temperature is to be measured according to the temperature code generation information in response to an internal operation command input from the memory controller 200. For example, the memory device 100 may omit an operation of measuring an internal temperature according to the determination of whether the internal temperature is to be measured. The memory device 100 may perform an internal operation corresponding to the internal operation command, based on the pre-generated temperature code.

Also, the memory device 100 may measure an internal temperature according to the determination of whether the internal temperature is to be measured. The memory device 100 may perform an internal operation corresponding to the internal operation command, based on a temperature code corresponding to the measured internal temperature.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving technique so as to improve operational performance. The interleaving technique may be a method for controlling operations on at least two memory devices 100 to overlap with each other.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
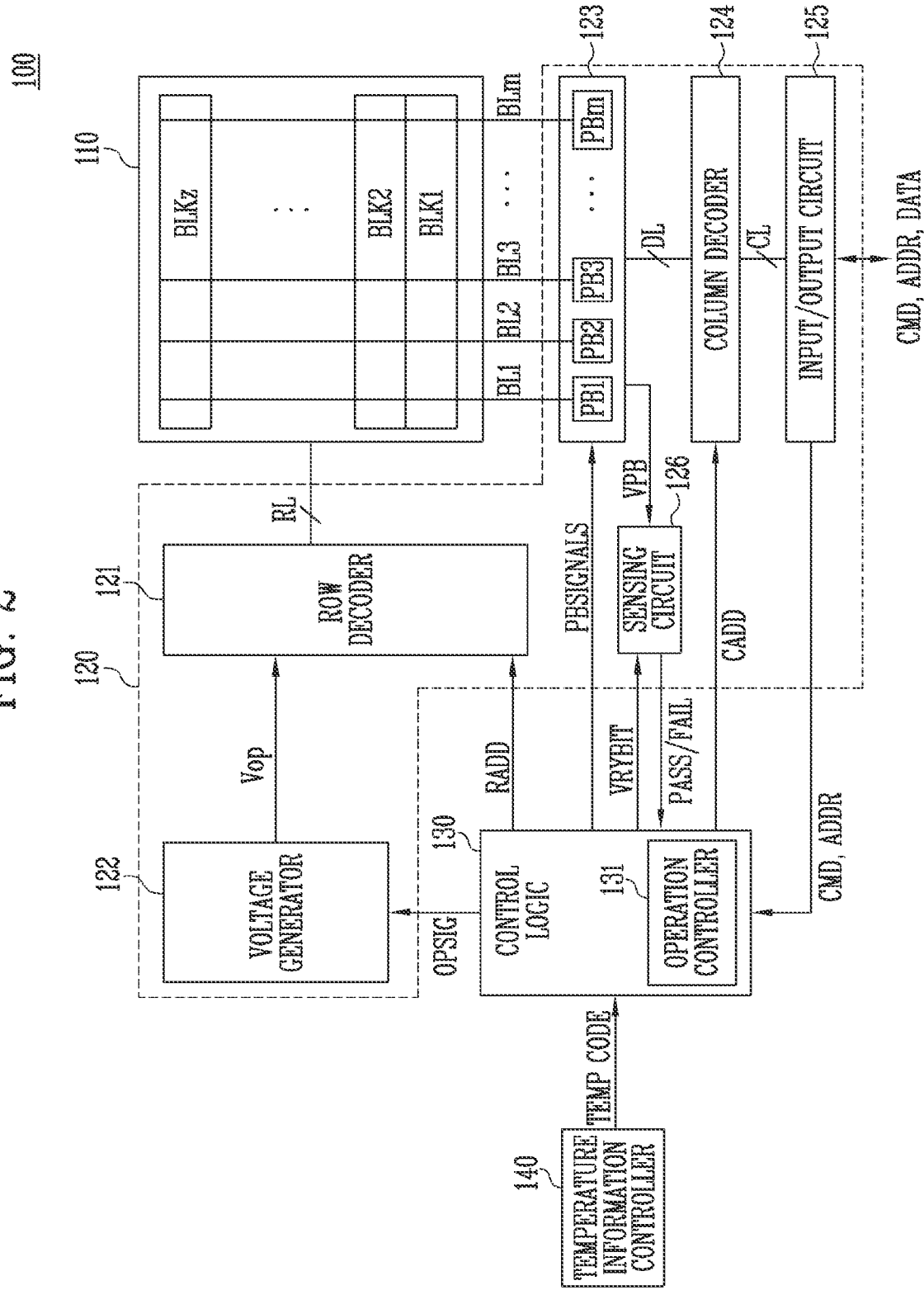
FIG. 2 is a diagram illustrating a structure of a memory device shown in FIG. 1.

FIG. 2 is a diagram illustrating a structure of the memory device 100 shown in FIG. 1.

Referring to FIG. 2, the memory device 100 may include a memory cell array 110, a peripheral circuit 120, control logic 130, and a temperature information controller 140. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm or discharge the applied voltages under the control of the control logic 130.

In an embodiment, the peripheral circuit 120 may perform a plurality of internal operations corresponding to a plurality of internal operation commands input from the memory controller 200.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory blocks.

The voltage generator 122 operates under the control of the control logic 130. The voltage generator 122 generates a plurality of voltages by using an external power voltage supplied to the memory device 100. For example, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110 respectively through first to mth bit lines BL1 to BLm. The first to mth bit lines BL1 to BLm operate under the control of the control logic 130. For example, the first to mth bit lines BL1 to BLm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

For example, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to mth page buffers PB1 to PBm read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and outputs the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL.

In an embodiment, the control logic 130 may include an operation controller 131.

The operation controller 131 may control the peripheral circuit 120 to perform an internal operation according to an internal operation command input from the memory controller 200.

In an embodiment, the operation controller 131 may control the peripheral circuit 120 to perform the internal operation, based on a temperature code TEMP CODE generated by the temperature information controller 140. For example, the operation controller 131 may control the voltage generator 122 to generate an internal voltage for performing the internal operation, based on the temperature code TEMP CODE generated by the temperature information controller 140. Also, the operation controller 131 may control the peripheral circuit 120 to perform the internal operation by using the internal voltage compensated according to the temperature code TEMP CODE.

The temperature information controller 140 may measure a temperature of the memory device 100. The temperature information controller 140 may provide the control logic 130 with the temperature code TEMP CODE having different voltage levels according to the measured temperature.

Figure 3:
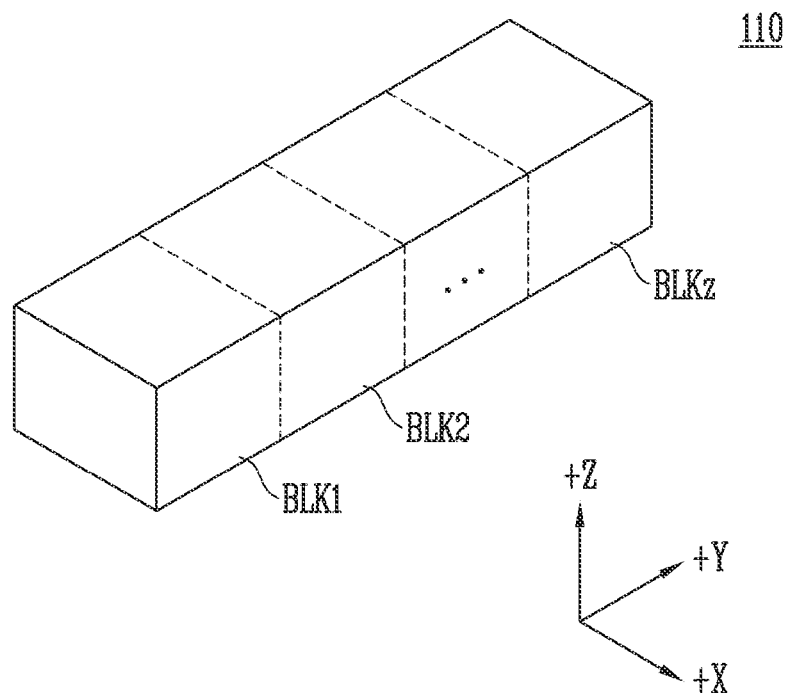
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
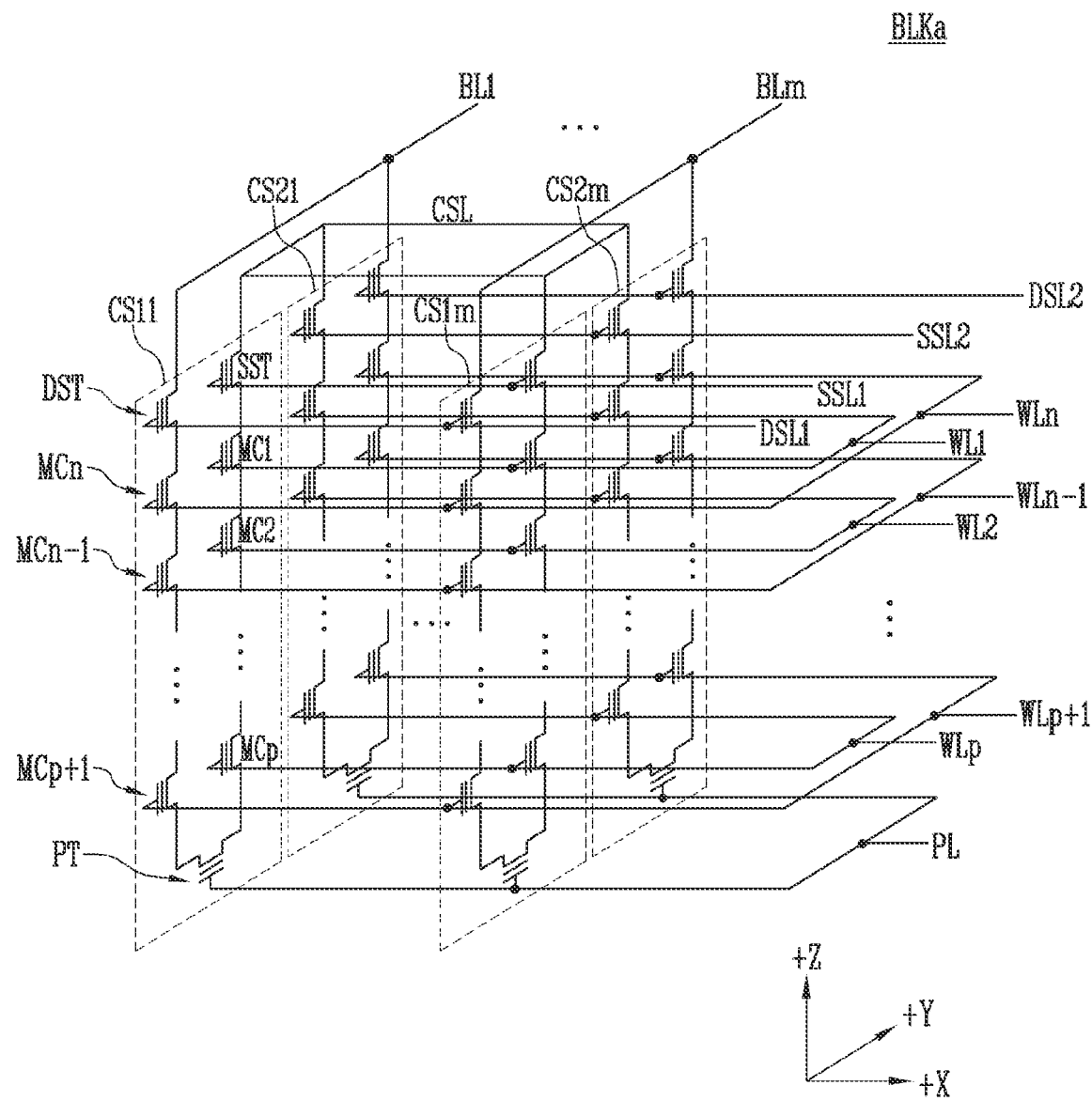
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1$m$ on a first row are connected to a first source select line SSL1. The source select transistors of the cell strings CS21 to CS2$m$ on a second row are connected to a second source select line SSL2.

In another embodiment, the source select transistors of the cell strings CS11 to CS1$m$ and CS21 to CS2$m$ may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1$m$ on the first row are connected to a first drain select line DSL1. The drain select transistors of the cell strings CS21 to CS2$m$ on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 5:
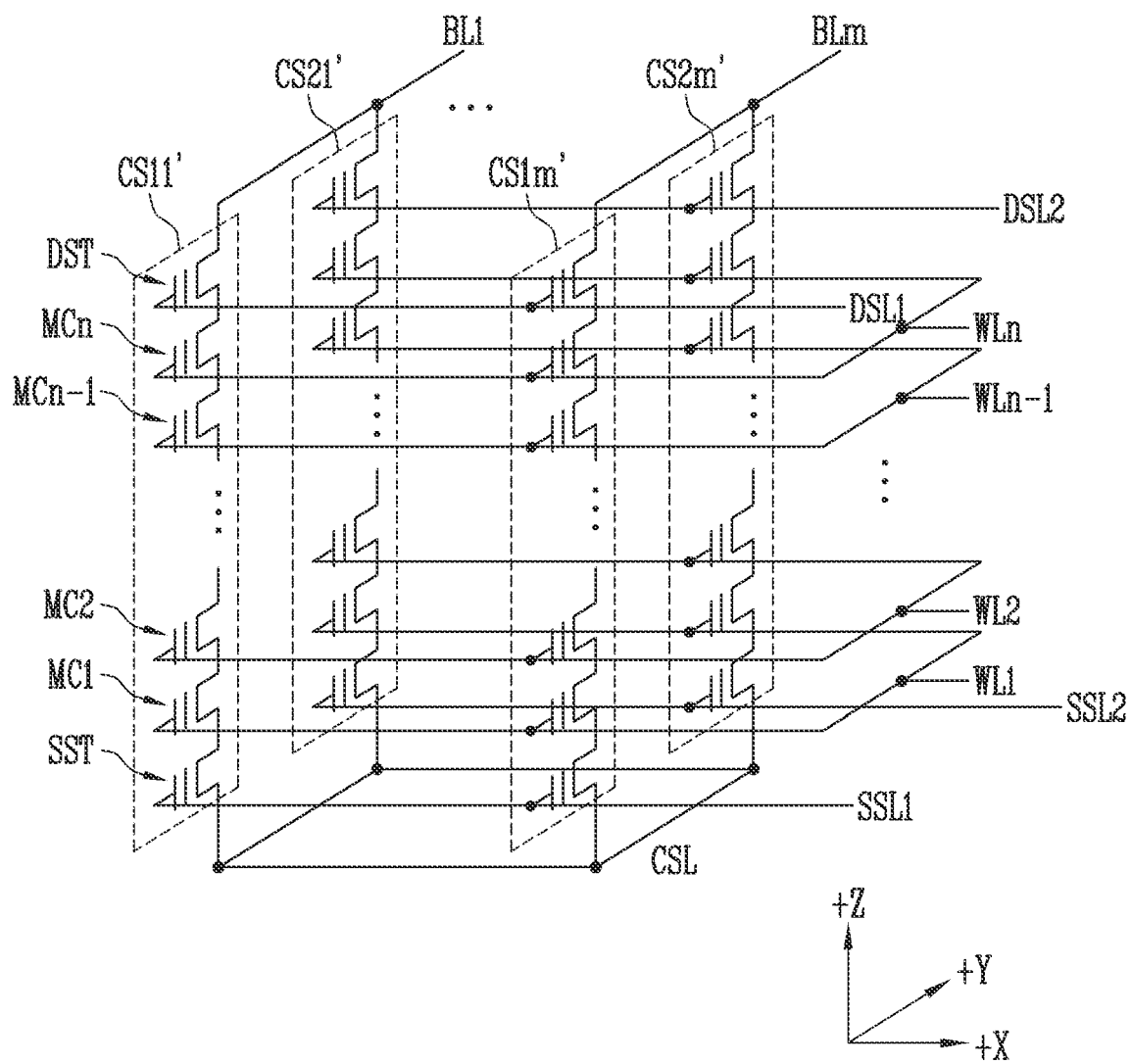
FIG. 5 is a circuit diagram illustrating another embodiment of the one memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
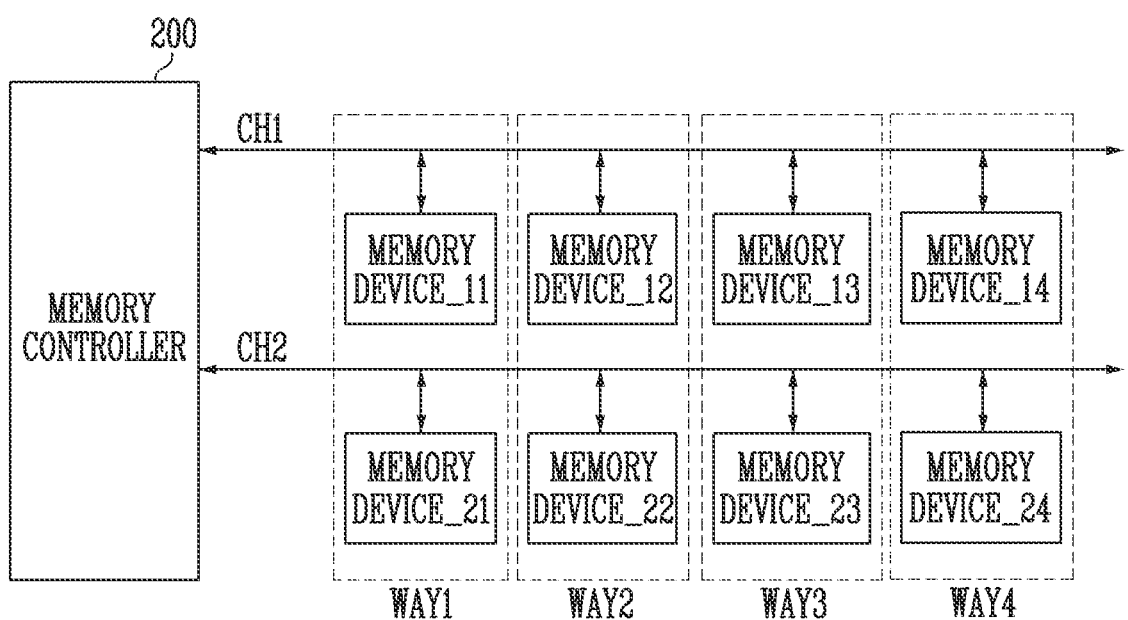
FIG. 6 is a diagram illustrating, for example, a connection relationship between a memory controller shown in FIG. 1 and a plurality of memory devices.

FIG. 6 is a diagram illustrating, for example, a connection relationship between the memory controller shown in FIG. 1 and a plurality of memory devices.

Referring to FIG. 6, the memory controller 200 may be connected to a plurality of memory devices (memory device_11 to memory device_24) through a plurality of channels CH1 and CH2. In an embodiment, it will be understood that the number of channels or the number of memory devices connected to each channel may be various modified. However, in this specification, it is assumed that the memory controller 200 is connected to memory devices through two channels, and four memory devices are connected to each channel.

For convenience of description, an operation of memory device_11, memory device_12, memory device_13, and memory device_14, which are connected to a first channel CH1, will be described. It will be understood that memory devices (memory device_21 to memory device_24) connected to the other channel CH2 are also operated like the memory device_11, the memory device_12, the memory device_13, and the memory device_14.

The memory device_11 to the memory device_14 may be commonly connected to the first channel CH1. The memory device_11 to the memory device_14 may communicate with the memory controller 200 through the first channel CH1. Since the memory device_11 to the memory device_14 are commonly connected to the memory controller 200 through the first channel CH1, only one memory device may communicate with the memory controller 200 at one time. However, operations internally performed respectively by the memory device_11 to the memory device_14 may be simultaneously performed. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The storage device using a plurality of memory devices can improve performance by using the interleaving technique described in FIG. 1. For the purpose of the interleaving technique, the memory devices may be managed in a channel and way unit. In order to maximize the parallelization of memory devices connected to each channel, the memory controller 200 may distribute and allocate a continuous logical memory zone in the channel and way unit.

For example, the memory controller 200 may transmit a command, a control signal including an address, and data to the memory device_11 through the first channel CH1. While the memory device_11 is programming the received data in a memory cell included therein, the memory controller may transmit a command, a control signal including an address, and data to the memory device_12.

In FIG. 6, the plurality of memory devices may constitute four ways WAY1 to WAY2. A first way WAY1 may include the memory device_11 and the memory device_21. A second way WAY2 may include the memory device_12 and the memory device_22. A third way WAY3 may include the memory device_13 and the memory device_23. A fourth way WAY4 may include the memory device_14 and the memory device_24.

Each of the channels CH1 and CH2 may be a bus of signals which share and use memory devices connected to the corresponding channel.

Although interleaving in a 2-channel/4-way structure has been described in FIG. 6, the interleaving may become more efficient as a number of channels increases and as a number of ways increases.

Figure 7:
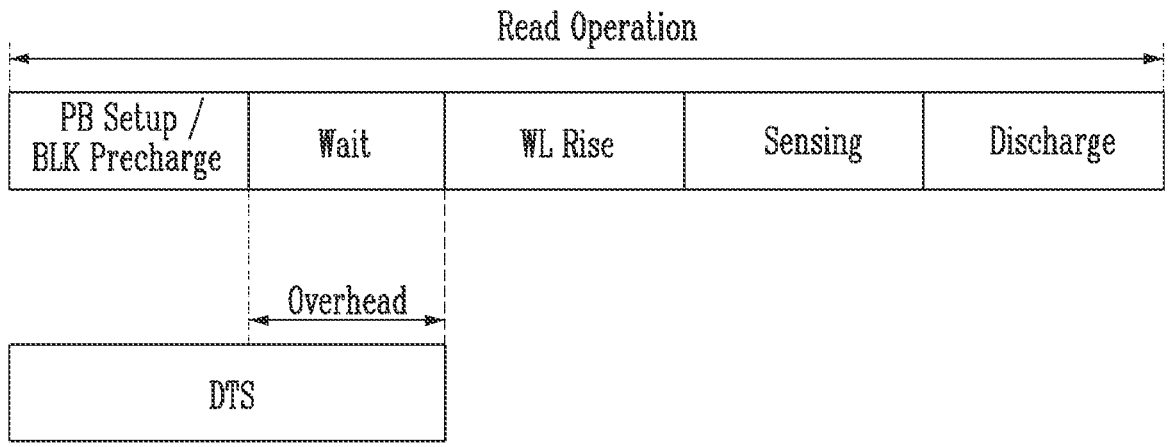
FIG. 7 is a diagram illustrating an internal operation of the memory device.

FIG. 7 is a diagram illustrating an internal operation of the memory device.

Referring to FIG. 7, the memory device 100 may perform an internal operation corresponding to an internal operation command input from the memory controller 200. The internal operation may include a read operation, a program operation, and an erase operation. Meanwhile, for convenience of description, an operation of measuring an internal operation of the memory device 100 in the read operation is illustrated in FIG. 7. However, the operation of measuring an internal operation of the memory device 100 may be performed even in the program operation or the erase operation.

In an embodiment, the read operation of the memory device 100 may include a page buffer setup operation PB Setup, a memory block precharge operation BLK Precharge, a temperature measuring operation DST, a word line rise operation WL Rise, a sensing operation Sensing, and a discharge operation Discharge. However, the above-described set of operations included in the read operation is merely an example, and another operation may be added in some embodiments.

For example, the memory device 100 may perform the temperature measuring operation DTS together with the page buffer setup operation PB Setup or the memory block precharge operation BLK Precharge at a time at which the read operation is started. The memory device 100 may perform the word line rise operation WL Rise after the temperature measurement operation DTS is completed. Therefore, the word line rise operation WL Rise is not performed until after the temperature measuring operation DTS has completed, and accordingly, overhead may occur in the read operation.

Since the memory device 100 performs the temperature measuring operation whenever the read operation performs, the time required to perform a plurality of read operation is lengthened, when an interval between the plurality of read operations is short.

Thus, in accordance with the embodiment of the present disclosure, the memory device 100 omits the temperature measuring operation with respect to internal operation commands input during a set period, and performs internal operations corresponding to the internal operation commands, based on a pre-generated temperature code, so that the operation speed of the memory device 100 can be improved.

Hereinafter, the memory device 100 in accordance with the embodiment of the present disclosure will be described with reference to FIG. 8.

Figure 8:
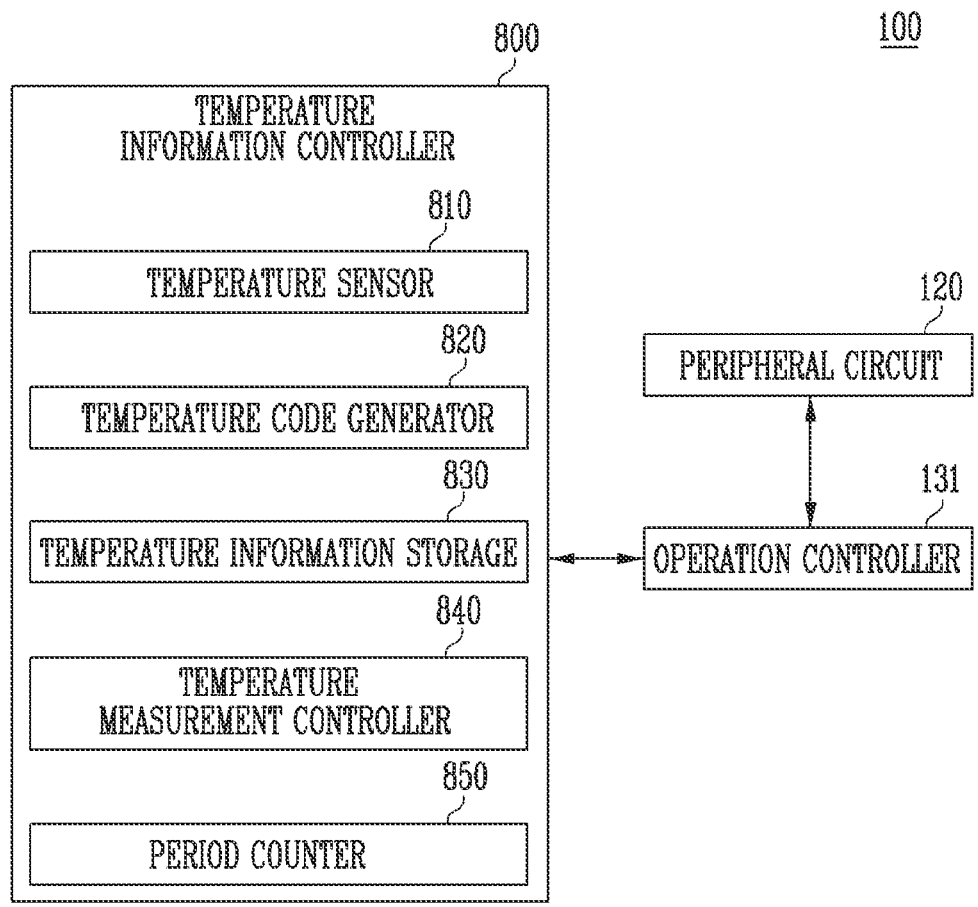
FIG. 8 is a diagram illustrating an example of the memory device in accordance with an embodiment of the present disclosure.

FIG. 8 is a diagram illustrating an example of the memory device in accordance with an embodiment of the present disclosure.

Referring to FIG. 8, the memory device 100 may include a peripheral circuit 120, an operation controller 131, and a temperature information controller 800.

In FIG. 8, the peripheral circuit 120 and the operation controller 131 may be respectively configured and operated identically to the peripheral circuit 120 and the operation controller 131, which are described with reference to FIG. 2. The temperature information controller 800 may represent the temperature information controller 140 shown in FIG. 2.

The temperature information controller 800 may include a temperature sensor 810, a temperature code generator 820, a temperature information storage 830, a temperature measurement controller 840, and a period counter 850.

The temperature sensor 810 may measure an internal temperature according to an internal operation command input from the memory controller 200. For example, the temperature sensor 810 may measure an internal temperature at a time at which an internal operation corresponding to the internal operation command is started. In an embodiment, the temperature sensor 810 may measure an internal temperature at a time at which an internal operation corresponding to a first internal operation command among a plurality of internal operation commands input from the memory controller 200 is performed. The first internal operation command may be input in a state in which any temperature code is not generated.

Also, the temperature sensor 810 may omit a temperature measuring operation for an internal operation corresponding to the internal operation command under the control of the temperature measurement controller 840. That is, the temperature sensor 810 might not measure an internal temperature used for the internal operation under the control of the temperature measurement controller 840.

The temperature code generator 820 may generate a temperature code corresponding to the measured internal temperature. For example, the temperature code generator 820 may generate a first temperature code corresponding to the measured internal temperature according to the first internal operation command.

The temperature information storage 830 may store a temperature code and temperature code generation information representing information that the temperature code has been generated during a set period. The set period may be a period set by a user or a period set in a process of manufacturing the memory device 100.

In an embodiment, the temperature code generation information may have a first state value representing information that the temperature code has generated. Also, in an embodiment, the temperature code generation information may have a second state value representing information that the temperature code has not been generated. The first state value may be '1' (or '0'), and the second state value may be '0' (or '1').

In an embodiment, the temperature information storage 830 may store the first temperature code generated according to the first internal operation command and temperature code generation information representing information that the first temperature code has been generated.

The temperature measurement controller 840 may determine whether an internal temperature is to be measured based on the temperature code generation information. For example, the temperature measurement controller 840 may determine whether an internal temperature at a time at which an internal operation corresponding to a second internal operation command input after the first internal operation command is input among the plurality of internal operation commands is performed is to be measured based on the temperature code generation information.

In an embodiment, the temperature measurement controller 840 may control the temperature sensor 810 to omit an operation of measuring the internal operation according to the determination of whether the internal temperature is to be measured. The operation controller 131 may control the peripheral circuit 120 to perform an internal operation corresponding to the second internal operation command, based on the first temperature code and the temperature code generation information, which are generated according to the first internal operation command. For example, when the temperature code generation information has the first state value at a time at which the internal operation corresponding to the second internal operation command is performed, the operation controller 131 may control the peripheral circuit 120 to perform the internal operation corresponding to the second internal operation command, based on the first temperature code generated according to the first internal operation command.

In an embodiment, the temperature measurement controller 840 may control the temperature sensor 810 to measure an internal temperature according to the determination of whether the internal operation is to be measured. For example, when the temperature code generation information has the second state value at a time at which the internal operation corresponding to the second internal operation command is performed, the temperature measurement controller 840 may control the temperature sensor 810 to measure an internal temperature at the time at which the internal operation corresponding to the second internal operation command is performed. The temperature code generator 820 may generate a second temperature code corresponding to the internal temperature measured at the time at which the internal operation corresponding to the second internal operation command is performed. The operation controller 131 may control the peripheral circuit 120 to perform the internal operation corresponding to the second internal operation command, based on the second temperature code generated according to the second internal operation command.

In an embodiment, the temperature measurement controller 840 may change a state value of the temperature code generation information. For example, when the first temperature code is generated according to the first internal operation command, the temperature measurement controller 840 may change the state value of the temperature code generation information to the first state value. Also, when the second temperature code is generated according to the second internal operation command, the temperature measurement controller 840 may change the state value of the temperature code generation information to the first state value. The first state value of the temperature code generation information may be maintained during a set period.

Also, when the set period elapses, the temperature measurement controller 840 may change the state value of the temperature code generation information to the second state value. For example, when it is determined that a period set by the period counter 850 has elapsed, the temperature measurement controller 840 may change the state value of the temperature code generation information from the first state value to the second state value.

The period counter 850 may generate a period count value subtracted for every set period from a time at which an internal temperature is measured. For example, when the first temperature code is generated according to the first internal operation command, the period counter 850 may generate a period count value. Also, when the second temperature code is generated according to the second internal operation command, the period counter 850 may generate a period count value.

In an embodiment, the period counter 850 may determine whether the set period has elapsed according to whether the subtracted period count value accords with a target count value. The target count value may be '0.' For example, when the subtracted period count value becomes 0 while the period count value is subtracted for every set period, the period count 850 may determine that the set period has elapsed such that the temperature code generation information has the first state value. The period counter 850 may provide the temperature measurement controller 840 with information that the set period has elapsed, and the temperature measurement controller 840 may change the state value of the temperature code generation information to the second state value in response to the information provided from the period counter 850.

Figure 9:
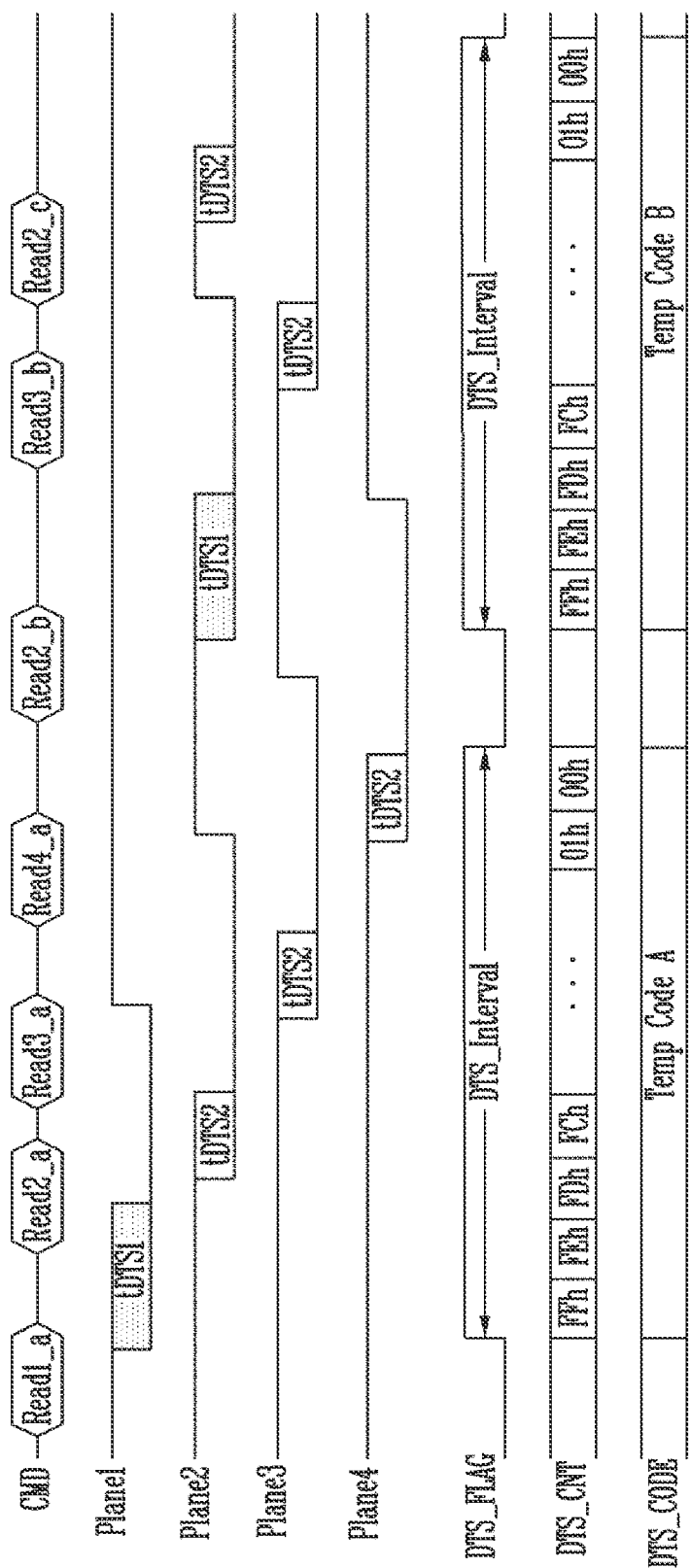
FIG. 9 is a diagram illustrating an example of performing an internal operation in accordance with an embodiment of the present disclosure.

FIG. 9 is a diagram illustrating an example of performing an internal operation in accordance with an embodiment of the present disclosure.

In FIG. 9, it is assumed that the memory device 100 includes a plurality of planes Plane1 to Plane4. Although a case where the memory device 100 includes four planes has been described, this is for convenience of description, and a number of planes included in one memory device is not limited to the embodiment shown in FIG. 9. In an embodiment, the plane may be a unit for independently performing a program operation, a read operation, or an erase operation on a group of memory blocks within the plane. In addition, the interleaving technique described in FIG. 1 may be applied to the plurality of planes Plane1 to Plane4.

When the memory device 100 receives a read command a(Read1_a) for a first plane Plane1 from the memory controller 200, the memory device 100 may perform a read operation corresponding to the read command a(Read1_a) for the first plane Plane1. The memory device 100 may generate a temperature code DTS_CODE. For example, the memory device 100 may generate a temperature code A(Temp Code A) by measuring an internal temperature to perform the read operation corresponding to the read command a(Read1_a) for the first plane Plane1. Also, the memory device 100 may change, to the first state value, a state value of temperature code generation information DTS_FLAG representing information that the temperature code has been generated. The first state value of the temperature code generation information DTS_FLAG may be maintained during a set period DTS_Interval. The memory device 100 may store the temperature code A(Temp Code A) during the set period DTS_Interval.

Subsequently, the memory device 100 may receive, from the memory controller 200, a read command a(Read2_a) for a second plane Plane2, a read command a(Read3_a) for a third plane Plane3, and a read command a(Read4_a) for a fourth plane Plane4. The temperature code generation information DTS_FLAG has the first state value at a time at which read operations respectively corresponding to the read command a(Read2_a) for the second plane Plane2, the read command a(Read3_a) for the third plane Plane3, and the read command a(Read4_a) for the fourth plane Plane4 are performed. The memory device 100 may omit an operation of measuring an internal temperature. Therefore, the memory device 100 may perform the read operations respectively corresponding to the read command a(Read2_a) for the second plane Plane2, the read command a(Read3_a) for the third plane Plane3, and the read command a(Read4_a) for the fourth plane Plane4, based on the temperature code A(Temp Code A).

Also, the memory device 100 may generate a period count value DTS_CNT at a time at which the temperature code A(Temp Code A) is generated. In an embodiment, the period count value DTS_CNT may include a start value FFh and an end value 00h. The memory device 100 may subtract the period count value DTS_CNT for every set period. When the subtracted period count value DTS_CNT corresponds to '0'(00h), the memory device 100 may change the state value of the temperature code generation information DTS_FLAG to the second state value. In some embodiments, the memory device 100 may remove the temperature code A(Temp Code A).

Subsequently, the memory device 100 may receive a read command b(Read2_b) for the second plane Plane2 from the memory controller 200. The memory device 100 may regenerate the temperature code DTS_CODE. For example, since the state value of the temperature code generation information DTS_FLAG is in a state in which the state value is changed to the second state value, the memory device 100 may generate a temperature code B(Temp Code B) by measuring an internal temperature to perform a read operation corresponding to the read command b(Read2_b) for the second plane Plane2. Also, the memory device 100 may change the state value of the temperature code generation information DTS_FLAG to the first state value. The first state value of the temperature code generation information DTS_FLAG may be maintained during the set period DTS_Interval. The memory device 100 may store the temperature code B(Temp Code B) during the set period DTS_Interval.

Subsequently, the memory device 100 may receive, from the memory controller 200, a read command b(Read3_b) for the third plane Plane3 and a read command c(Read2_c) for the second plane Plane2. The temperature code generation information DST_FLAG has the first state value at a time at which read operations respectively corresponding to the read command b(Read3_b) for the third plane Plane3 and the read command c(Read2_c) for the second plane Plane2 are performed. The memory device 100 may omit an operation of measuring an internal temperature. Therefore, the memory device 100 may perform the read operations respectively corresponding to the read command b(Read3_b) for the third plane Plane3 and the read command c(Read2_c) for the second plane Plane2, based on the temperature code B (Temp Code B).

Also, the memory device 100 may generate a period count value DST_CNT at a time at which the temperature code B (Temp Code B) is generated. In an embodiment, the period count value DTS_CNT may include a start value FFh and an end value 00h. The memory device 100 may subtract the period count value DTS_CNT for every set period. When the subtracted period count value DTS_CNT corresponds to '0'(00h), the memory device 100 may change the state value of the temperature code generation information DTS_FLAG to the second state value. In some embodiments, the memory device 100 may remove the temperature code B (Temp Code B).

Thus, in accordance with the embodiment of the present disclosure, since each of the read operations respectively corresponding to the read command a(Read1_a) for the first plane Plane1 and the read command b(Read2_b) for the second plane Plane2 performs the operation of measuring an internal operation, the time(tDTS1) required to perform the read operation is long. On the other hand, since each of the read operations respectively corresponding to the other read commands except the read command a(Read1_a) for the first plane Plane1 and the read command b(Read2_b) for the second plane Plane2 does not perform the operation of measuring an internal temperature, the time(tDTS2) required to perform the read operation is reduced.

Figure 10:
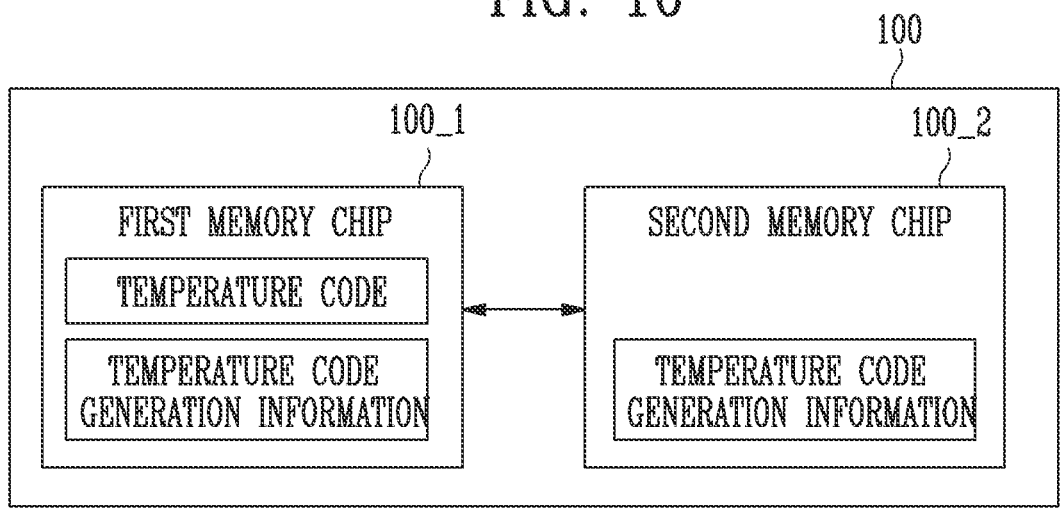
FIG. 10 is a diagram illustrating another example of the memory device in accordance with an embodiment of the present disclosure.

FIG. 10 is a diagram illustrating another example of the memory device in accordance with an embodiment of the present disclosure.

In FIG. 10, the memory device 100 may be a memory package including a plurality of memory chips 100_1 and 100_2. Although a case where the memory device 100 includes two memory chips has been described, this is for convenience of description, and a number of memory chips included in one memory device is not limited to the embodiment shown in FIG. 10. In addition, the interleaving technique described in FIG. 1 may be applied to the plurality of memory chips 100_1 and 100_2.

In an embodiment, each of a first memory chip 100_1 and a second memory chip 100_2 may include the temperature information controller 800 shown in FIG. 8. However, the present disclosure is not necessarily limited thereto. In some embodiments, one temperature information controller may generate a temperature code and temperature code generation information on each of the first memory chip 100_1 and the second memory chip 100_2.

The first memory chip 100_1 may receive a first internal operation command from the memory controller 200. Also, the first memory chip 100_1 may store a temperature code generated according to the first internal operation command and temperature code generation information representing information that the temperature code has been generated during a set period. A state value of the temperature code generation information may have the first state value.

The second memory chip 100_2 may receive a second internal operation command from the memory controller 200 after the first internal operation command is input to the first memory chip 100_1. Also, the second memory chip 100_2 may perform an internal operation corresponding to the second internal operation command, based on the temperature code stored in the first memory chip 100_1, in response to the second internal operation command.

For example, it is assumed that any temperature code is not generated in the second memory chip 100_2, and temperature code generation information stored in the second memory chip 100_2 has the second state value. For example, the second memory chip 100_2 may first check the temperature code generation information stored in the second memory chip 100_2. Since the temperature code generation information of the second memory chip 100_2 has the second state value, the temperature code generation information of the first memory chip 100_1 may be checked. For example, the second memory chip 100_2 may request the first memory chip 100_1 of the temperature code generation information stored in the first memory chip 100_1. Since the temperature code generation information stored in the first memory chip 100_1 has the first state value, the second memory chip 100_2 may perform an internal operation corresponding to the second internal operation command, based on the temperature code stored in the first memory chip 100_1.

Meanwhile, the first memory chip 100_1 and the second memory chip 100_2 may further include an interface for controlling communication between the memory chips to perform an operation of sharing the above-described temperature code.

In addition, although a case where a temperature code is shared between a plurality of memory chips has been described in FIG. 10, the present disclosure is not necessarily limited thereto. In some embodiments, a temperature code may be shared between a plurality of memory devices.

Figure 11:
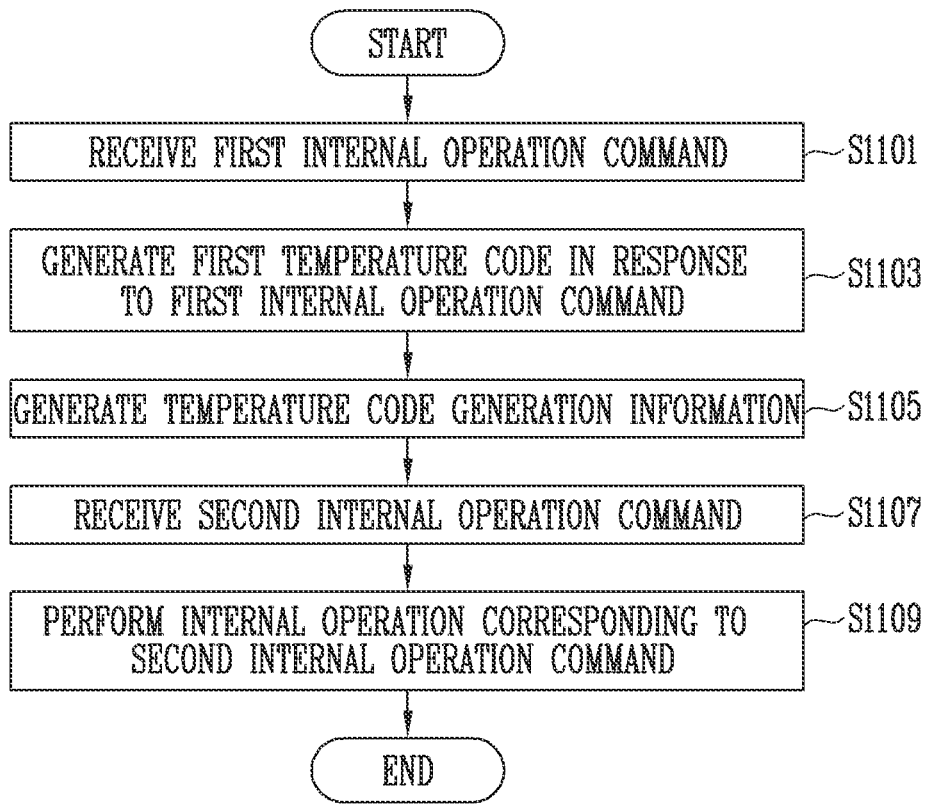
FIG. 11 is a flowchart illustrating an operating method of the memory device in accordance with an embodiment of the present disclosure.

FIG. 11 is a flowchart illustrating an operating method of the memory device in accordance with an embodiment of the present disclosure.

The operating method shown in FIG. 11 may be performed by, for example, the memory device 100 shown in FIG. 2 or 8.

In step S1101, the memory device 100 may receive a first internal operation command from the memory controller 200.

In step S1103, the memory device 100 may generate a first temperature code corresponding to an internal temperature at a time at which an internal operation corresponding to the first internal operation command is performed, in response to the first internal operation command.

In step S1105, the memory device 100 may generate temperature code generation information representing information that the first temperature code has been generated during a set period. For example, the memory device 100 may generate temperature code generation information having a first state value representing information that the first temperature code has been generated according to the first internal operation command.

In step S1107, the memory device 100 may receive a second internal operation command from the memory controller 200. For example, the memory device 100 may receive the second internal operation command after the memory device 100 receives the first internal operation command.

In step S1109, the memory device 100 may perform an internal operation corresponding to the second internal operation command, based on the first temperature code and the temperature code generation information, which are generated according to the first internal operation command, in response to the second internal operation command.

Figure 12:
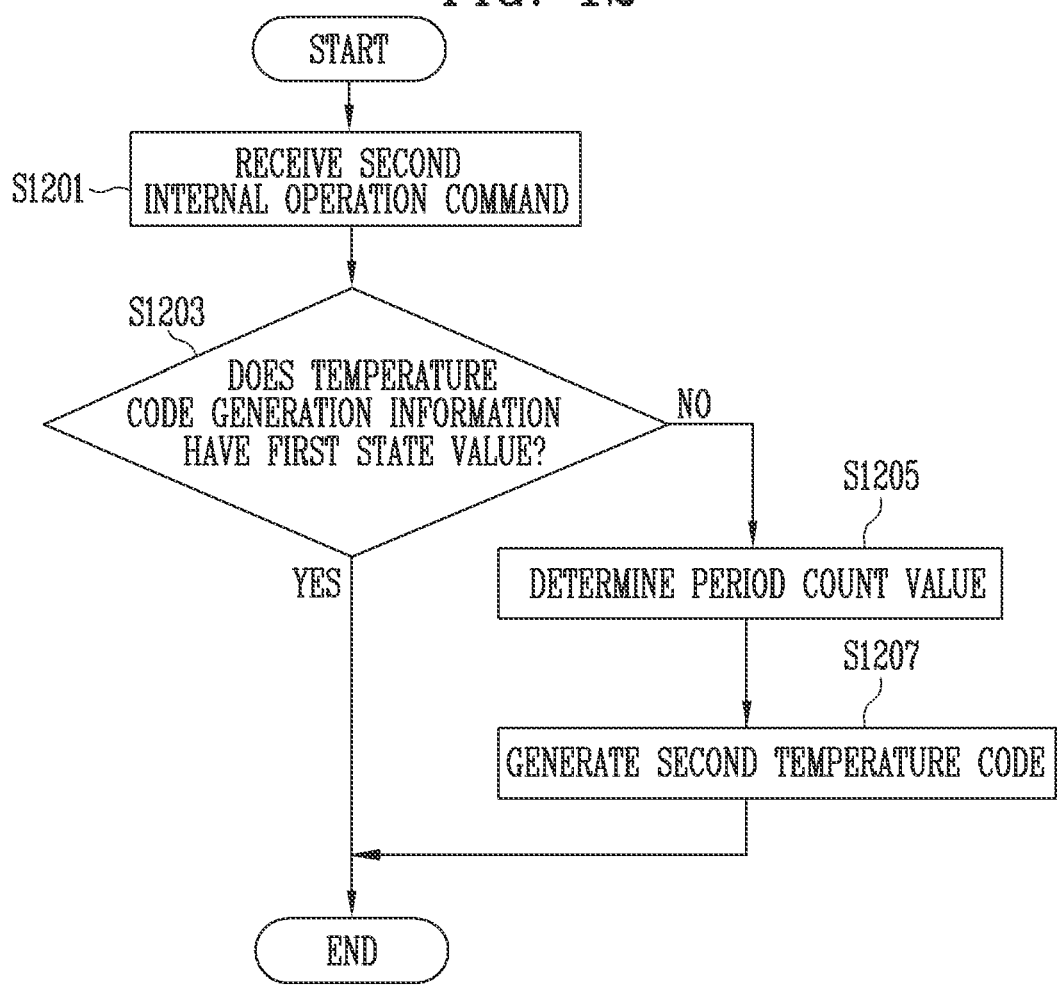
FIG. 12 is a flowchart illustrating a method for generating a temperature code in accordance with an embodiment of the present disclosure.

FIG. 12 is a flowchart illustrating a method for generating a temperature code in accordance with an embodiment of the present disclosure.

The method shown in FIG. 12 may be performed by, for example, the memory device 100 shown in FIG. 2 or 8.

In step S1201, the memory device 100 may receive a second internal operation command from the memory controller 200.

In step S1203, the memory device 100 may determine whether temperature code generation information has a first state value, in response to the second internal operation command. For example, the memory device 100 may determine whether an internal temperature is to be measured based on the temperature code generation information, in response to the second internal operation command.

When the temperature code generation information has the first state value, based on a determination result in the step S1203, the memory device 100 might not measure the internal temperature. The memory device 100 may perform an internal operation corresponding to the second internal operation command, based on a first temperature code generated according to a first internal operation command.

Alternatively, when the temperature code generation information does not have the first state value, based on a determination result in the step S1203, in step S1205, the memory device 100 may generate a period count value subtracted for every set period from a time at which the internal temperature is measured. For example, when the temperature code generation information has a second state value instead of the first state value, the memory device 100 may generate a period count value.

In step S1207, the memory device 100 may generate second temperature code corresponding to an internal temperature at a time at which an internal operation corresponding to the second internal operation command is performed, in response to the temperature code generation information having the second state value. The memory device 100 may perform the internal operation corresponding to the second internal operation command, based on the second temperature code generated according to the second internal operation command.

Figure 13:
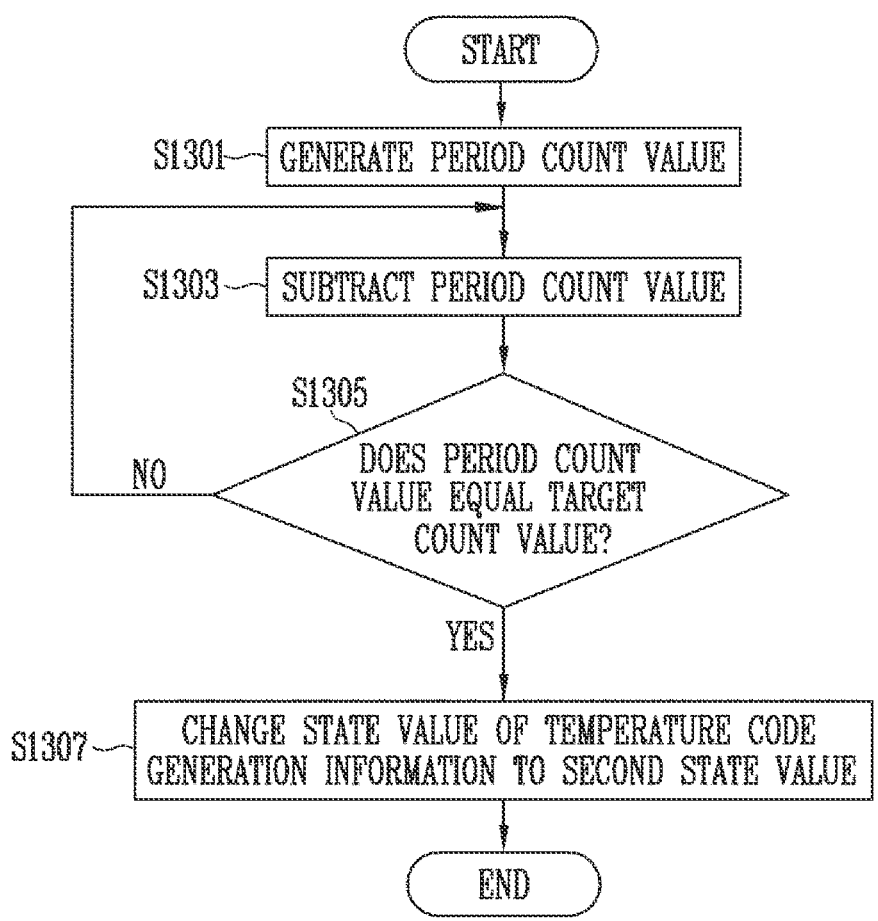
FIG. 13 is a flowchart illustrating a method for changing temperature code generation information in accordance with an embodiment of the present disclosure.

FIG. 13 is a flowchart illustrating a method for changing temperature code generation information in accordance with an embodiment of the present disclosure.

The method shown in FIG. 13 may be performed by, for example, the memory device 100 shown in FIG. 2 or 8.

In step S1301, the memory device 100 may generate a period count value. For example, the period count value may be generated at a time at which an internal temperature is measured.

In step S1303, the memory device 100 may subtract the period count value. For example, the memory device may reversely count the period count value from the period count value to '0.' A period in which the period count value is reversely counted from the period count value to '0' may correspond to that in which temperature code generation information maintains a first state value.

In step S1305, the memory device 100 may determine whether the period count value equals a target count value. The target count value may be, for example, '0.'

When the period count value does not equal the target count value, based on a determination result in the step S1305, the memory device 100 may proceed to the step S1303 to subtract the period count value. That is, the memory device 100 performs the steps S1303 and S1305 until the period count value becomes '0.' When the period count value becomes '0,' the memory device 100 may determine that a set period has elapsed. The set period may be a period in which the temperature code generation information maintains the first state value. Therefore, the memory device 100 may manage the period in which the temperature code generation information maintains the first state value through the steps S1303 and S1305.

When the period count value is equal with the target count value, based on a determination result in the step S1305, in step S1307, the memory device 100 may change, to a second state value, a state value of the temperature code generation information at a time at which the set period elapses.

Figure 14:
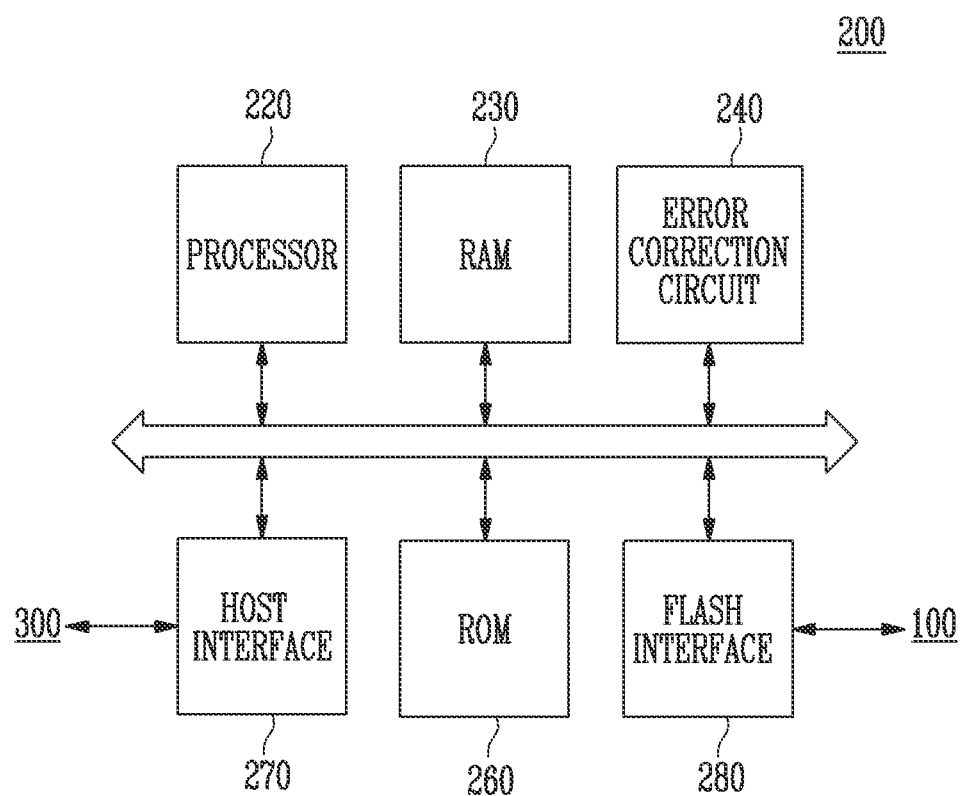
FIG. 14 is a diagram illustrating the memory controller shown in FIG. 1.

FIG. 14 is a diagram illustrating the memory controller shown in FIG. 1.

Referring to FIGS. 1 and 14, the memory controller 200 may include a processor 220, a RAM 230, an error correction circuit 240, ROM 250, a host interface 270, and a flash interface 280.

The processor 220 may control overall operations of the memory controller 200. The RAM 230 may be used as a buffer memory, a cache memory, a working memory, etc. of the memory controller 200.

The error correction circuit 240 may perform error correction. The error correction circuit 240 may perform error correction code (ECC) encoding on data to be written to the memory device through the flash interface 280. The ECC-decoded data may be transferred to the memory device through the flash interface 280. The error correction circuit 240 may perform ECC decoding on data received from the memory device through the flash interface 280. For example, the error correction circuit 240 may be included as a component of the flash interface 280 in the flash interface 280.

The ROM 260 may store, in the form of firmware, various information required in an operation of the memory controller 200.

The memory controller 200 may communicate with an external device (e.g., the host 300, an application processor, or the like) through the host interface 270.

The memory controller 200 may communicate with the memory device 100 through the flash interface 280. The memory controller 200 may transmit a command CMD, an address ADDR, a control signal CTRL, and the like to the memory device 100 through the flash interface 280, and receive data DATA. For example, the flash interface 280 may include a NAND interface.

Figure 15:
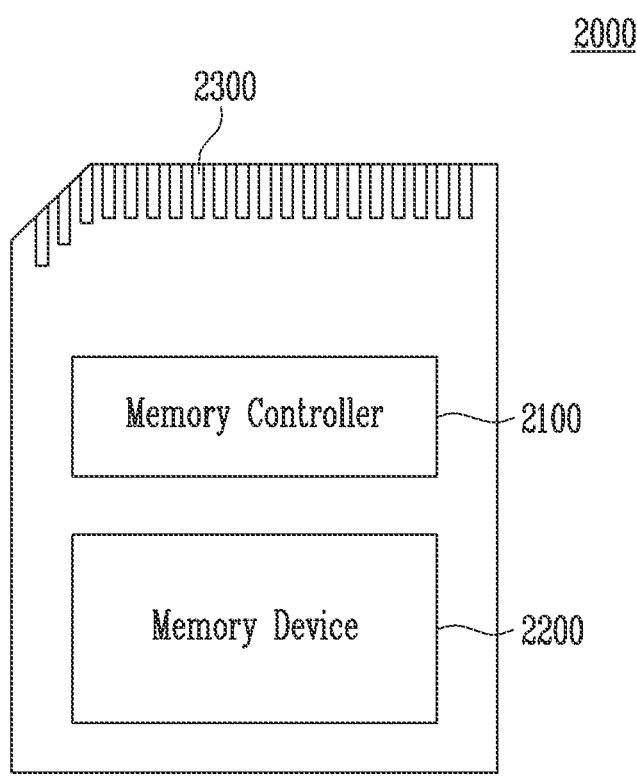
FIG. 15 is a block diagram illustrating a memory card system to which the storage device is applied in accordance with an embodiment of the present disclosure.

FIG. 15 is a block diagram illustrating a memory card system to which the storage device is applied in accordance with an embodiment of the present disclosure.

Referring to FIG. 15, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 2.

For example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. For example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

For example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 16:
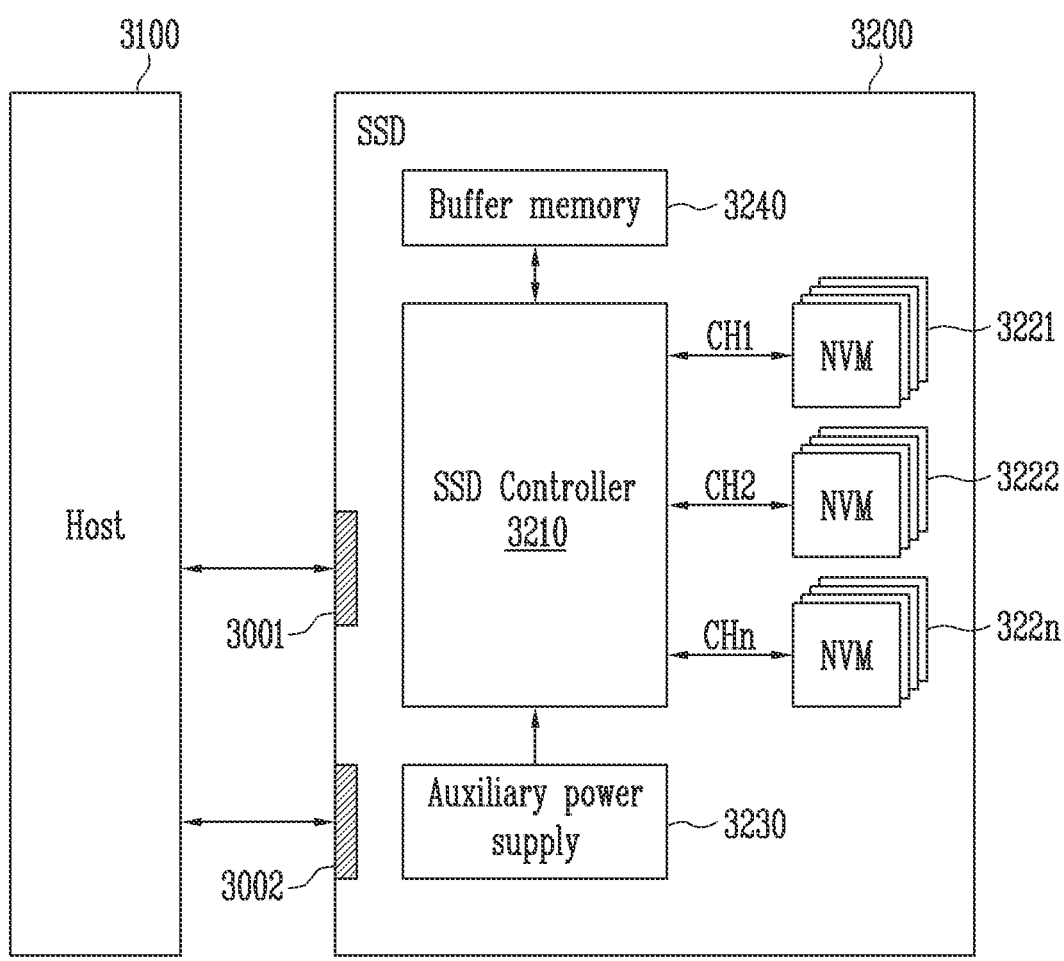
FIG. 16 is a block diagram illustrating, for example, a Solid State Drive (SSD) system to which the storage device is applied in accordance with an embodiment of the present disclosure.

FIG. 16 is a block diagram illustrating, for example, a Solid State Drive (SSD) system to which the storage device is applied in accordance with an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. For example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. For example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 17:
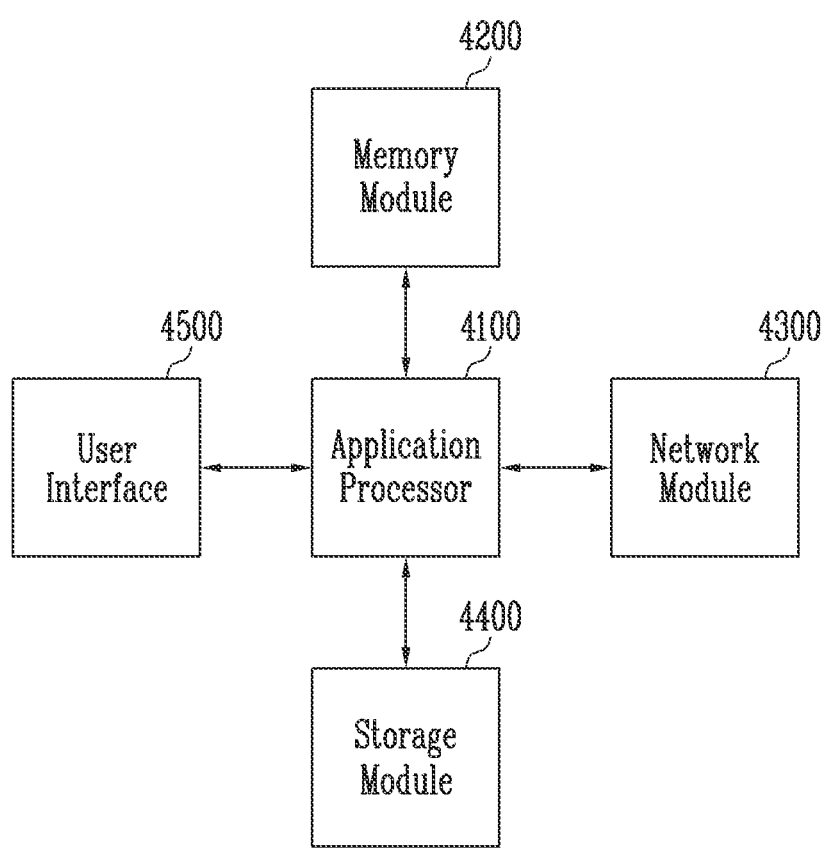
FIG. 17 is a block diagram illustrating a user system to which the storage device is applied in accordance with an embodiment of the present disclosure.

FIG. 17 is a block diagram illustrating a user system to which the storage device is applied in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. For example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. For example, the application processor 4100 and the memory module 4200 may be provided as one semiconductor package by being packaged based on a Package on Package (PoP).

The network module 4300 may communicate with external devices. For example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. For example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. For example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device having an improved operation speed and an operating method of the memory device.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for operating a memory device comprising a first memory chip and a second memory chip, the method comprising:
   receiving, by the first memory chip, a first internal command input from a memory controller;
   generating, by the first memory chip, a first temperature code corresponding to the first internal command, wherein the first temperature code indicates an internal temperature when the first internal command is received from the memory controller;
   receiving, by the second memory chip, a second internal command input from the memory controller during a predetermined period from when the first temperature code is generated; and
   performing, by the second memory chip, a second internal operation corresponding to the second internal command, using the first temperature code.

2. The method of claim 1, further comprising generating, by the second memory chip, temperature code generation information indicating when the first temperature code was generated.

3. The method of claim 2, wherein, in the generating of the temperature code generation information, the temperature code generation information is changed to a first state value when the first temperature code is generated.

4. The method of claim 3, wherein the second internal operation is performed using the first temperature code when the temperature code generation information is the first state value.

5. The method of claim 3, further comprising changing, by the first memory chip, the first state value of the temperature code generation information to a second state value when the predetermined period has elapsed from when the first temperature code is generated.

6. The method of claim 5, further comprising generating, by the second memory chip, a second temperature code corresponding to the second internal command when the temperature code generation information is the second state value, wherein the second temperature code indicates an internal temperature when the second internal command is received from the memory controller.

7. The method of claim 6, wherein the second internal operation is performed using the second temperature code.

8. A memory device comprising:
   a first memory chip configured to receive a first internal command input from a memory controller, and store a first temperature code generated according to the first internal command and temperature code generation information representing information that the first temperature code has been generated during a predetermined period; and
   a second memory chip configured to receive a second internal command input from the memory controller after the first internal command is input to the first memory chip, and perform an internal operation corresponding to the second internal command, based on the first temperature code and the temperature code generation information, which are stored on the first memory chip, in response to the second internal command.

9. The memory device of claim 8, wherein a state value of the temperature code generation information is changed to a first state value when the first temperature code is generated.

10. The memory device of claim 9, wherein the second memory chip performs the internal operation corresponding to the second internal command using the first temperature code when the state value of the temperature code generation information is the first state value.

11. The memory device of claim 9, wherein the first state value is changed to a second state value when the predetermined period has elapsed from when the first temperature code is generated.

12. The memory device of claim 11, wherein the second memory chip generates a second temperature code corresponding to the second internal command when the state value of the temperature code generation information is the second state value.

13. The memory device of claim 12, wherein the second memory chip performs the internal operation using the second temperature code.

14. The memory device of claim 8, wherein the internal operation is one of a read operation, a program operation, and an erase operation.

* * * * *